US007825341B2

(12) United States Patent
Kamada et al.

(10) Patent No.: US 7,825,341 B2
(45) Date of Patent: Nov. 2, 2010

(54) ANTENNA DEVICE AND SHIELD COVER THEREOF

(75) Inventors: Kenichi Kamada, Akita (JP); Junichi Noro, Akita (JP); Satoshi Satoh, Akita (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 12/169,817

(22) Filed: Jul. 9, 2008

(65) Prior Publication Data

US 2008/0296058 A1 Dec. 4, 2008

(51) Int. Cl.
*H05K 9/00* (2006.01)

(52) U.S. Cl. ......................... 174/384; 174/382; 361/816

(58) Field of Classification Search ................. 174/350, 174/377, 382, 384; 361/816, 818
See application file for complete search history.

(56) References Cited

U.S. PATENT DOCUMENTS 5,195,644 A * 3/1993 Schmid ......................... 220/6
6,687,135 B1 * 2/2004 Kitade ......................... 361/816
7,414,584 B2 * 8/2008 Kamada et al. ........ 343/700 MS
2004/0025334 A1 * 2/2004 Wen et al. ..................... 29/832

FOREIGN PATENT DOCUMENTS

JP 8-293688 11/1996

* cited by examiner

*Primary Examiner*—Hung V Ngo
(74) *Attorney, Agent, or Firm*—Whitham Curtis Christofferson & Cook, PC

(57) ABSTRACT

A circuit board has a first face and a second face opposite to the first face. An antenna element is mounted on the first face. A shield cover is attached to the second face. The shield cover includes a polygonal base portion, a first wall provided on a first side of the polygonal base portion, a second wall provided on a second side of the polygonal base portion, a third wall provided on a corner defined by the first side and the second side, and disposed between the first wall and the second wall, a first extending portion extended from the first wall so as to overlap with the third wall, and a second extending portion extended from the second wall so as to overlap with the third wall. The shield cover is soldered on the second face.

3 Claims, 7 Drawing Sheets

FIG. 4 (A)
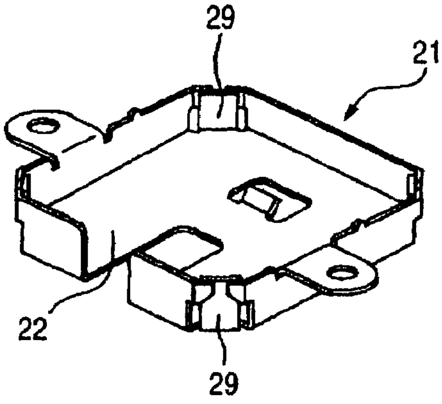
FIG. 4 (I)
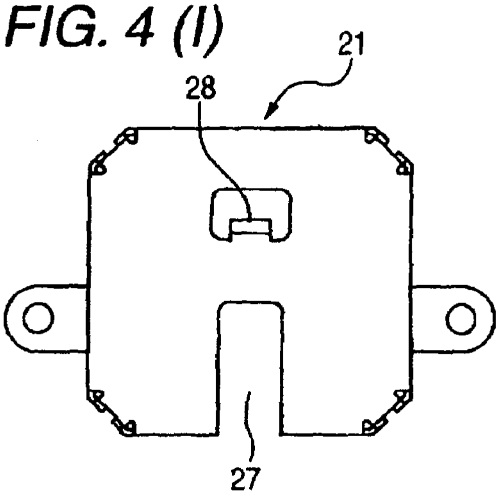
FIG. 4 (E)
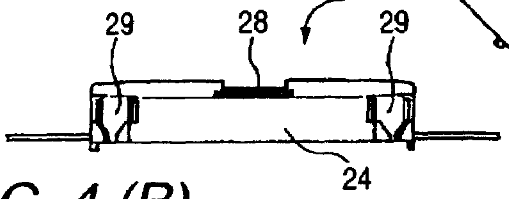
FIG. 4 (G)
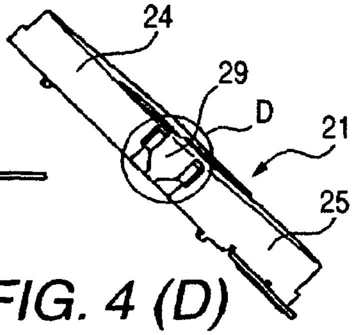
FIG. 4 (B)
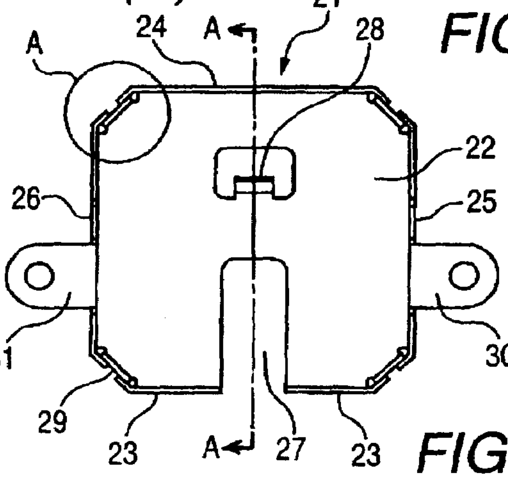
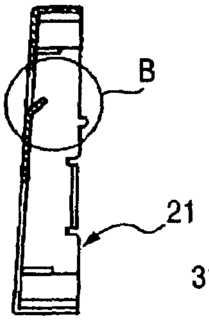
FIG. 4 (C)
FIG. 4 (D)
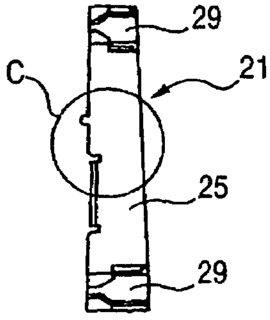
FIG. 4 (H)
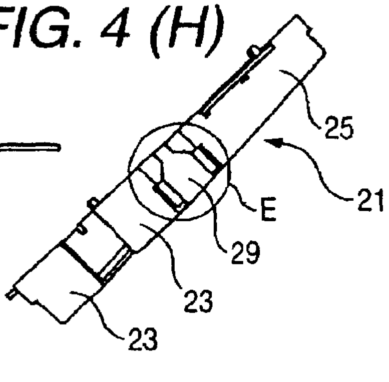
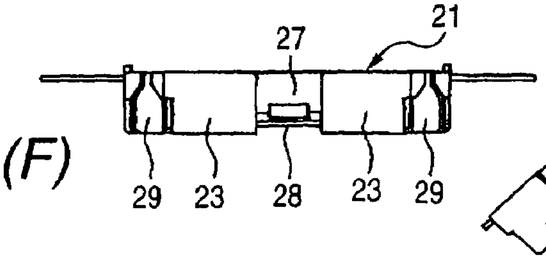
FIG. 4 (F)

ANTENNA DEVICE AND SHIELD COVER THEREOF

The disclosure of Japanese Patent Application No. 2006-023874 filed Jan. 31, 2006 including specification, drawings and claims is incorporated herein by reference in its entirety.

BACKGROUND

The present invention relates to an antenna device and a shield cover. More particularly, the present invention relates to a structure of a shield cover of a personal type small antenna device used for a digital radio receiving set capable of listening to digital radiobroadcasting when electric waves sent from an artificial satellite, which will be referred to as satellite electric waves hereinafter, or electric waves on the ground, which will be referred to as ground electric waves hereinafter, are received.

Recently, digital radio receivers operable to receive the satellite electric waves or the ground electric waves and capable of listening to the digital radiobroadcasting. These digital radio receivers have already been actually put into practical use in the United States. In general, these digital radio receivers are mounted on mobile bodies such as automobiles and capable of receiving electric waves, the frequency of which is in the frequency band of 2.3 GHz, so as to listen to the radiobroadcasting. That is, the digital radio receivers are radio receivers capable of listening to mobile radiobroadcasting. Since the frequency of the electric waves to be received is in the frequency band of about 2.3 GHz, the wave-length (the resonance wave-length) λ of the electric waves to be received is about 128.3 mm. In a case where these digital radio receivers receive the ground waves, the ground waves are transmitted in such a manner that satellite waves are once received by a global station and then transmitted again by linear polarization after the frequency has been a little shifted. The satellite electric waves are of the circular polarization. On the other hand, the ground electric waves are of the linear polarization.

In this digital radiobroadcasting, electric waves are used, the frequency of which is in the frequency band of about 2.3 GHz. Therefore, in order to receive the electric waves, it is necessary to install an antenna device outdoors.

These digital radio receivers includes a receiver mounted on automobiles, a receiver installed in houses, and a portable receiver, the electric power sources of which are batteries. A specific example of the portable digital radio receiver is a portable electronic device such as a portable acoustic device. This portable electronic device includes not only a digital tuner used for listening to digital radiobroadcasting but also an optical disk drive for regenerating an optical disk such as a compact disk (CD), an amplifier and a speaker. These components are integrally built in a housing.

On the other hand, various structures of antennas are provided as the antennas capable of receiving electric waves, the frequency band of which is about 2.3 GHz. The antenna can be divided into two main types by its shape. One is a plane type (a flat plate type) antenna which is a patch antenna and the other is a cylindrical antenna such as a loop antenna or a helical antenna. The plane type antenna and the cylindrical type antenna described above are prepared separately from the housing of the portable electronic device and connected to the digital radio tuner, which is built in the housing through a cable and a connector, and used.

The antenna device used for satellite radiobroadcasting includes: an antenna case; and an antenna module accommodated in the antenna case. The antenna module includes: a circuit board having a primary side and a reverse side; a plane antenna element such as a patch antenna mounted in the primary side of the circuit board; an LNA (low noise amplification) circuit mounted on the reverse side of the circuit board; and a shield cover for shielding the LNA circuit.

In a plan view, the shield cover is formed into a substantial rectangle, the four corners of which are chamfered. That is, the shield cover has corner portions at the four corners. The shield cover is attached to a reverse side of the circuit board when the four corners (the corner portions) are soldered.

A related-art shield cover 21 will be explained in detail with reference to the FIGS. 1(A) to 1(F) and FIGS. 2(A) to (C). As shown in FIG. 1(A), the shield cover 21 is composed symmetrically with respect to center line A-A of FIG. 1(B). The shield cover 21 includes: a substantially rectangular ceiling portion 22, the four corners of which are chamfered; and four side wall portions 23, 24, 25, 26 which are formed on four sides of outer periphery of the ceiling portion 22. The four side wall portions 23, 24, 25, 26 are respectively referred to as a front side wall portion, a rear side wall portion, a right side wall portion and a left side wall portion. The front side wall portion 23 is composed of a pair of front side pieces which are separate from each other with respect to center line A-A. An opening 27, into which a coaxial cable is inserted, is provided between both the front wall pieces. As shown in FIGS. 1(B), 1(D), and 1(F), a soldering portion 28, to which an earth line of the coaxial cable is soldered, is formed at a position opposed to the opening 27 in the ceiling portion 22. Further, the shield cover 21 includes corner portions 29 which are formed at four corners. In both end portions 25, 26, protruding portions 30, 31, used for fixing the shield cover 21 to a base which is referred to as "a bottom cover", are formed.

When the wall portions 23, 24, 25, 26 and the corner portions 29 are bent by a right angle with respect to the ceiling portion 22, the shield cover 21 shown in FIG. 1(A) is composed.

This shield cover 21 is soldered onto a reverse side of the circuit board at the corner portions 29. At this time, as shown in FIGS. 1(C), 1(E), 2(B) and 2(C), the protruding portions 32, 33, which are formed in both side wall portions 25, 26, are respectively inserted into the holes formed on the circuit board.

In this connection, a shielding case for shielding the board arranged inside is described in Japanese Patent Publication No. 08-293688A, for example.

However, in the case of the related-art shield cover 21, the following problems may be caused. As shown in FIGS. 1(A) and 2(A), at the bent portions (the bent portions between four side wall portions 23 to 26 and the corner portions 29) of the shield cover 21, gaps G are generated. As a result, the ground property of this shield cover 21 is low.

In this connection, the shielding case described in Japanese Patent Publication No. 08-293688A is used for shielding the board arranged inside. Therefore, the structure of the shielding case described in Japanese Patent Publication No. 08-293688A is different from that of the shield cover attached onto the reverse side of the circuit board for shielding a circuit such as an LNA (low noise amplifying) circuit mounted on the reverse side of the circuit board.

SUMMARY

It is therefore an object of the invention to provide an antenna having high ground property.

In order to achieve the above described object, according to the invention, there is provided antenna device comprising:

a circuit board having a first face and a second face opposite to the first face;

an antenna element mounted on the first face; and a shield cover attached to the second face and including:

a polygonal base portion;

a first wall provided on a first side of the polygonal base portion;

a second wall provided on a second side of the polygonal base portion;

a third wall provided on a corner defined by the first side and the second side, and disposed between the first wall and the second wall;

a first extending portion extended from the first wall so as to overlap with the third wall; and a second extending portion extended from the second wall so as to overlap with the third wall; and the shield cover is soldered on the second face.

According to the invention, there is also provided a shield cover adapted to shield a circuit which is mounted on a circuit board, the shield cover comprising:

a polygonal base portion;

a first wall provided on a first side of the polygonal base portion and extending in a first direction;

a second wall provided on a second side of the polygonal base portion and extending in a second direction;

a third wall provided on a corner defined by the first side and the second side, and disposed between the first wall and the second wall;

a first extending portion extended from the first wall so as to overlap with the third wall; and a second extending portion extended from the second wall so as to overlap with the third wall.

The first extending portion may be formed on a part of an edge of the first wall while separating from the polygonal base.

The second extending portion may be formed on a part of an edge of the second wall while separating from the polygonal base.

The shield cover may be monolithically formed by a metal sheet.

With this configuration, between the first wall and the third wall and between the second wall and the third wall, no gaps are formed on a soldering side of the shield cover. Therefore, an entire chamfered corner of the shield cover can be soldered. Accordingly, the ground property of the antenna device and the shield cover can be enhanced. Since the first and second extending portions are formed while separating from the polygonal base portion, manufacturing can be easily performed. Further, since the shield cover is monolithically formed by a metal sheet, manufacturing can be simply performed and the cost can be reduced.

BRIEF DESCRIPTION OF THE DRAWINGS

The above objects and advantages of the present invention will become more apparent by describing in detail preferred exemplary embodiments thereof with reference to the accompanying drawings, wherein:

FIG. 4(A) is a perspective view showing the shield cover;

FIG. 4(B) is a lower face view of the shield cover;

FIG. 4(C) is a section view taken on center line A-A in FIG. 4(B);

FIG. 4(D) is a right side view of the shield cover;

FIG. 4(E) is a rear view of the shield cover;

FIG. 4(F) is a front view of the shield cover;

FIG. 4(G) is a front right side view of the shield cover;

FIG. 4(H) is a rear right side view of the shield cover;

FIG. 4(I) is a plan view of the shield cover;

DETAILED DESCRIPTION OF THE EMBODIMENTS

Hereinafter, an embodiment of an antenna device and an shield cover thereof according to the invention will be discussed with reference to the accompanying drawings.

Figure 1:
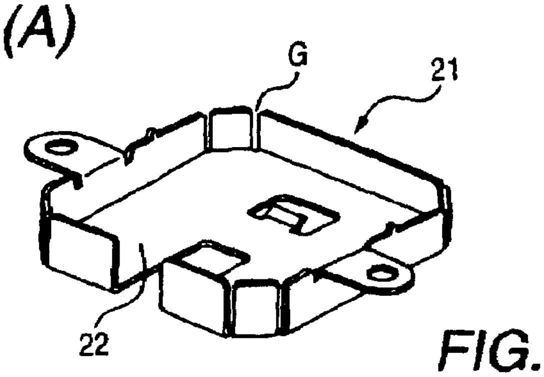
FIG. 1 (A) (Prior Art)
FIG. 1(A) is a perspective view showing a related-art shield cover.
FIG. 1(B) is a lower plan view of the related-art shield cover.
FIG. 1(C) is a sectional view taken on center line A-A in FIG. 1(B)
FIG. 1(D) is a plan view of the related-art shield cover.
FIG. 1(E) is a left side view of FIG. 1(D)
FIG. 1(F) is a front view of FIG. 1(B)
Figure 1:
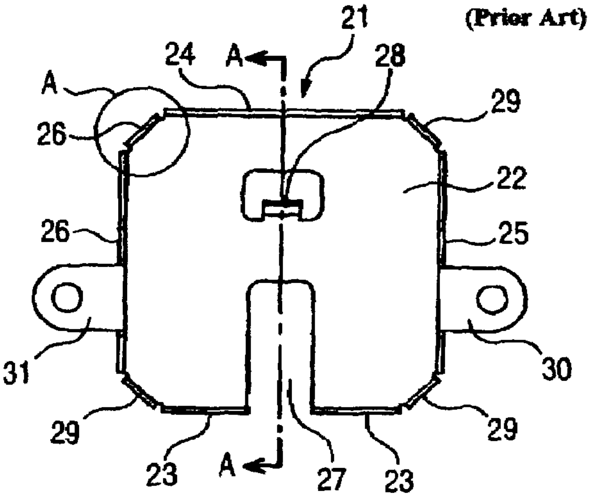
FIG. 1 (B) (Prior Art)
Figure 1:
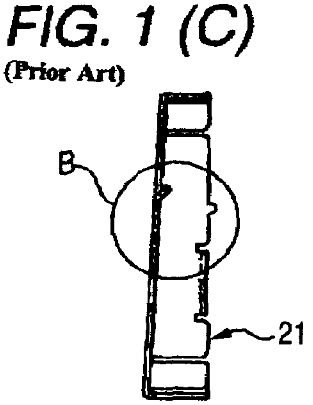
FIG. 1 (C) (Prior Art)
Figure 1:
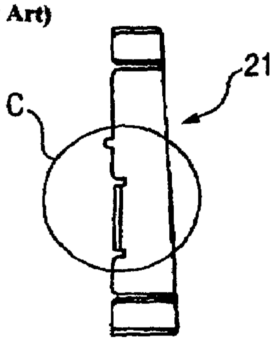
FIG. 1 (E) (Prior Art)
Figure 1:
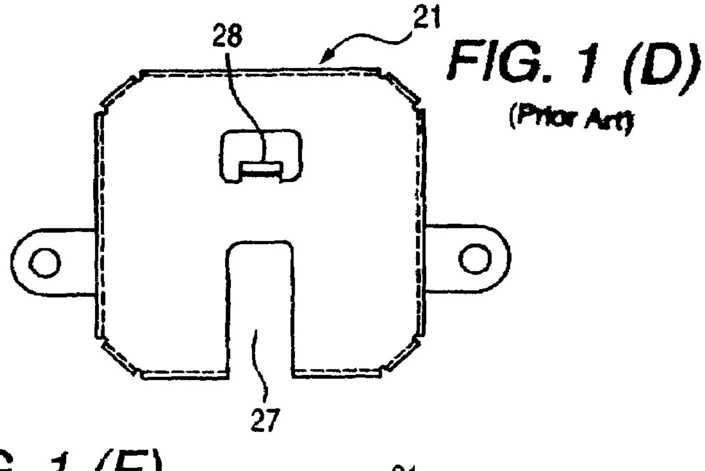
FIG. 1 (D) (Prior Art)
Figure 1:
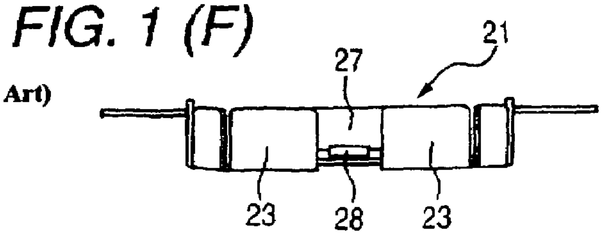
FIG. 1 (F) (Prior Art)
Figure 2:
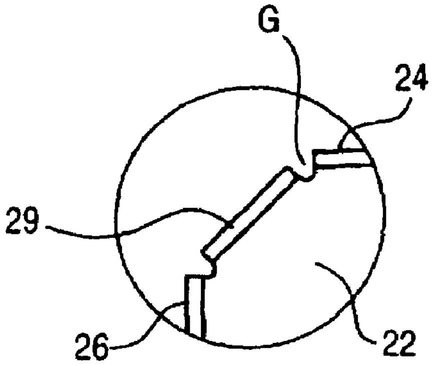
FIG. 2 (A) (Prior Art)
FIG. 2(A) is an enlarged view of a portion encircled by circle A in FIG. 1(B)
FIG. 2(B) is an enlarged view of a portion encircled by circle B in FIG. 1(C)
FIG. 2(C) is an enlarged view of a portion encircled by circle C in FIG. 1(E)
Figure 2:
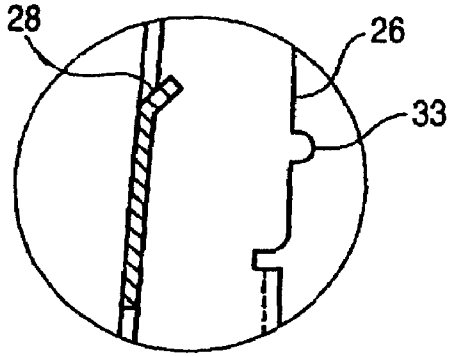
FIG. 2 (B) (Prior Art)
Figure 2:
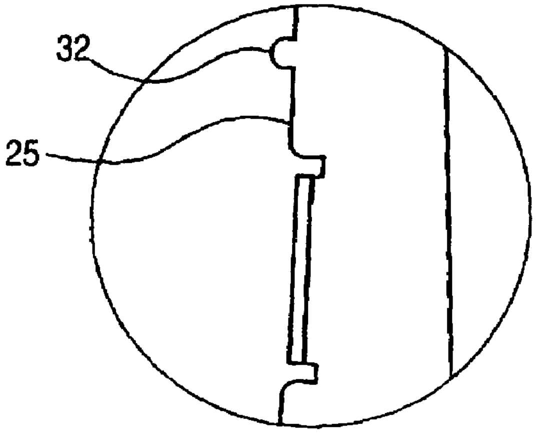
FIG. 2 (C) (Prior Art)
Figure 3:
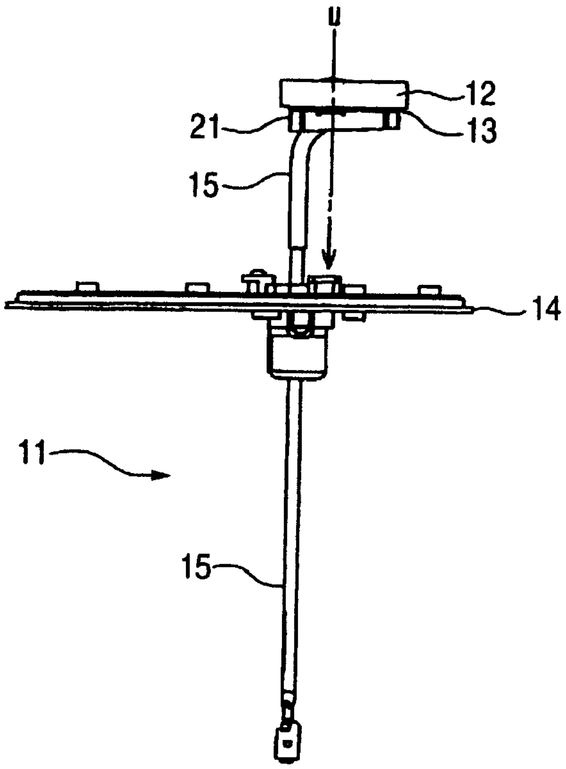
FIG. 3(A) is a front view showing an antenna device before the completion of assembling according to an embodiment of the present invention.
FIG. 3(B) is a plan view showing the antenna device after the completion of assembling.
FIG. 3(C) is a front view of FIG. 3(B)
Figure 3:
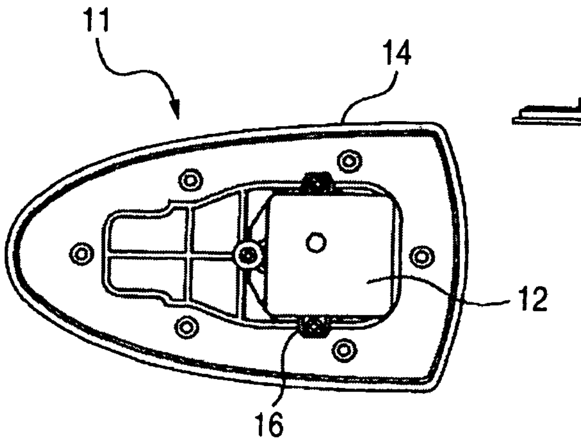
Figure 3:
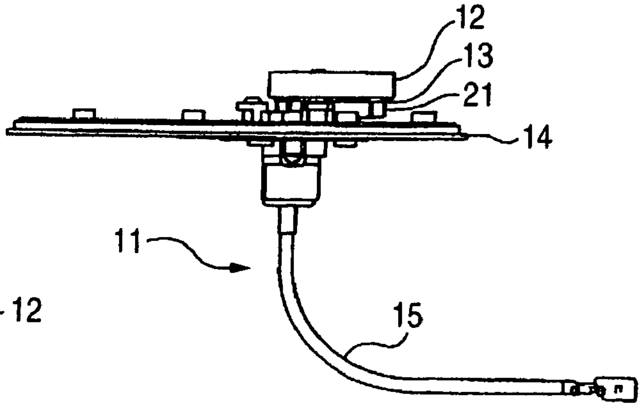
Figure 5:
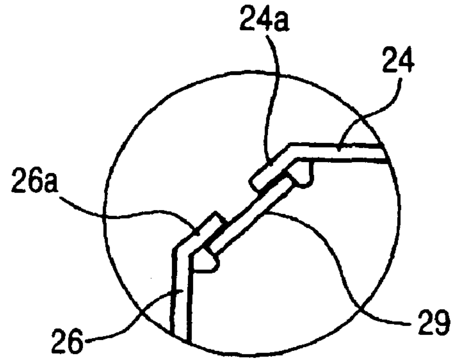
FIG. 5(A) is an enlarged view of a portion encircled by circle A in FIG. 4(B)
FIG. 5(B) is an enlarged view of a portion encircled by circle B in FIG. 4(C)
FIG. 5(C) is an enlarged view of a portion encircled by circle C in FIG. 4(D)
FIG. 5(D) is an enlarged view of a portion encircled by circle D in FIG. 4(G)
FIG. 5(E) is an enlarged view of a portion encircled by circle E in FIG. 4(H)
Figure 5:
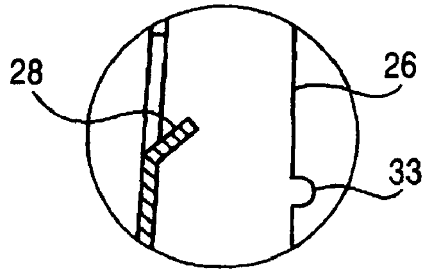
Figure 5:
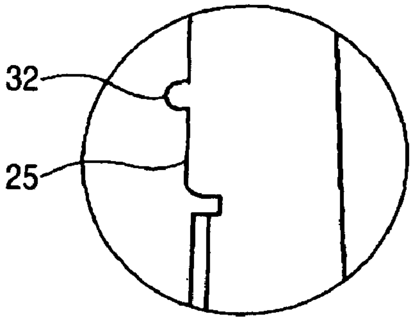
Figure 5:
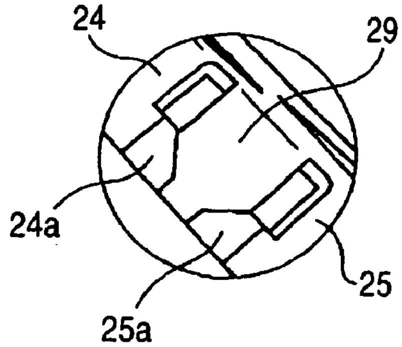
Figure 5:
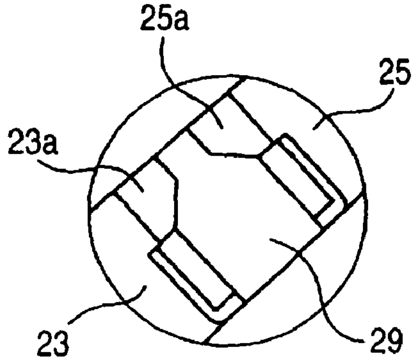

As shown in FIGS. 3(A) to 3(C), a plane antenna element 12 is arranged at the uppermost portion of the antenna device 11. The plane antenna element 12 is mounted on a surface of the circuit board 13. A reverse side of the circuit board 13 is covered with a shield cover 21. The plane antenna element 12, the circuit board 13 and the shield cover 21 are mounted on a base 14. One end portion of the coaxial cable 15 is connected to the circuit board 13 and the other end portion is led out under a base 14 through the shield cover 21 and the base 14. The shield cover 21 is fixed to the base 14 by a pair of screws 16. In the antenna device 11, a cover (not shown) is attached to the base 14 by means of screws. Therefore, the plane antenna element 12, the circuit board 13 and the shield cover 21 are tightly closed by the base 14 and the cover.

As shown in FIGS. 4(A) to 4(I) and FIGS. 5(A) to 5(E), when the shield cover 21 of the antenna device according to the embodiment of the present invention is compared with the conventional shield cover 21, a different point is the constitution of four side walls 23 to 26 of the shield cover 21 of the antenna device. Other points of the constitution are the same. Therefore, the explanations of the same points are omitted here and only different points will be explained below.

Figure 6:
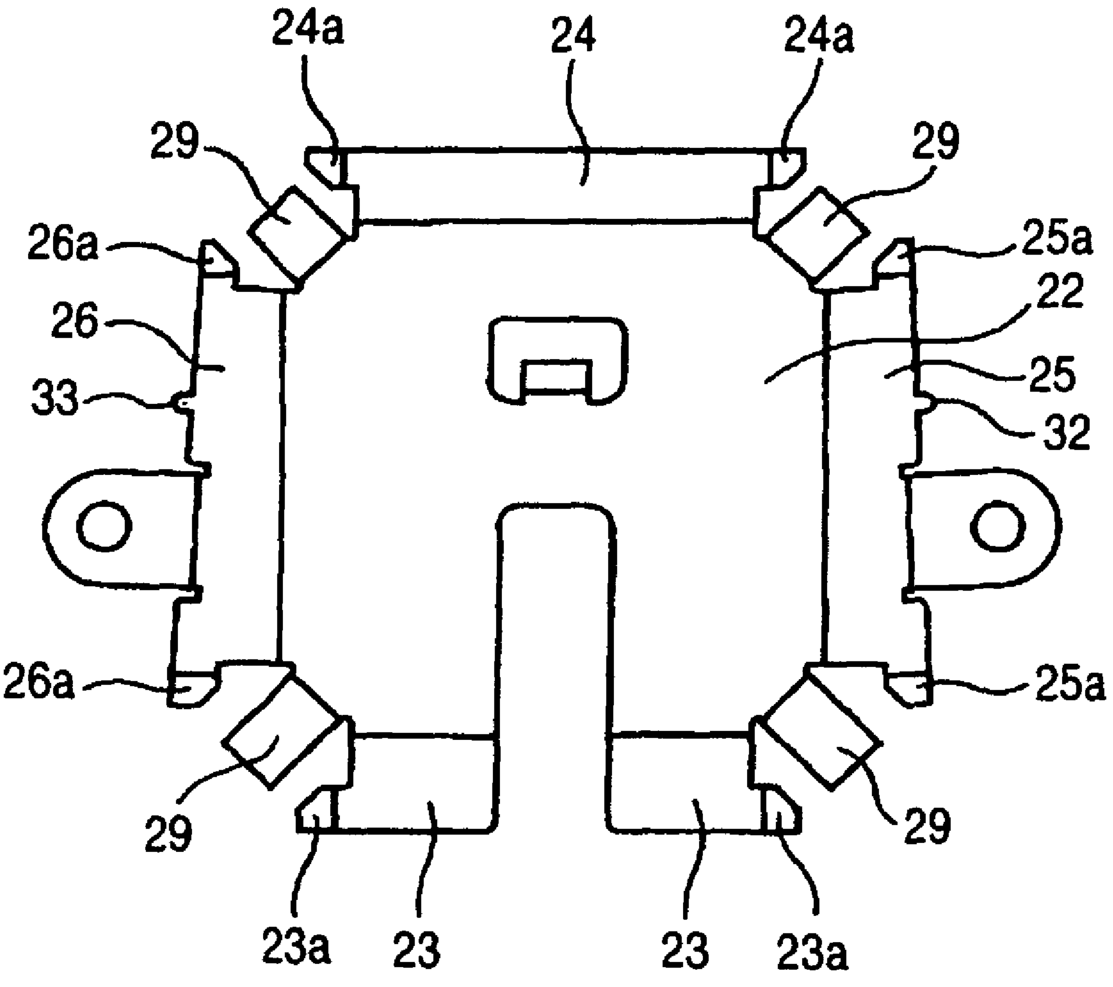
FIG. 6 is an developed view of the shield cover.

As shown in FIG. 6, only in a portion, which is separated from the ceiling portion 22, at each of both end portions of the front side wall portion 23, the rear side wall portion 24, the right side wall portion 25 and the left side wall portion 26, the extending portions 23*a*, 24*a*, 25*a*, 26*a*, are respectively formed.

When each side wall portion 23, 24, 25, 26 and each corner portion 29 are bent making a right angle with respect to the ceiling portion 22, the shield cover 21 shown in FIG. 4(A) is composed. In this case, when each extending portion 23*a*, 24*a*, 25*a*, 26*a* is bent by an angle 45 degrees with respect to each side wall portion 23, 24, 25, 26, each extending portion is put on each corner portions 29. Accordingly, no gap is formed between each side wall portion 23, 24, 25, 26 on the distant side from the ceiling portion 22 (on the side close to the circuit board 13) and each corner portion 29. When shield cover 21 is composed as described above, manufacturing can be easily performed.

Figure 7:
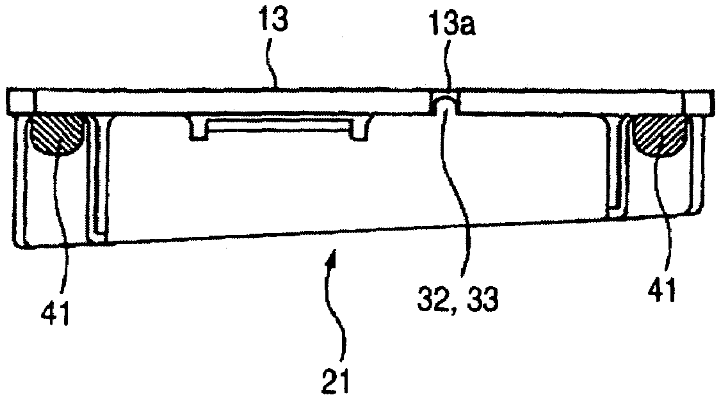
FIG. 7 is a side view showing a state in which the shield cover is attached to a circuit board by soldering.
Figure 8:
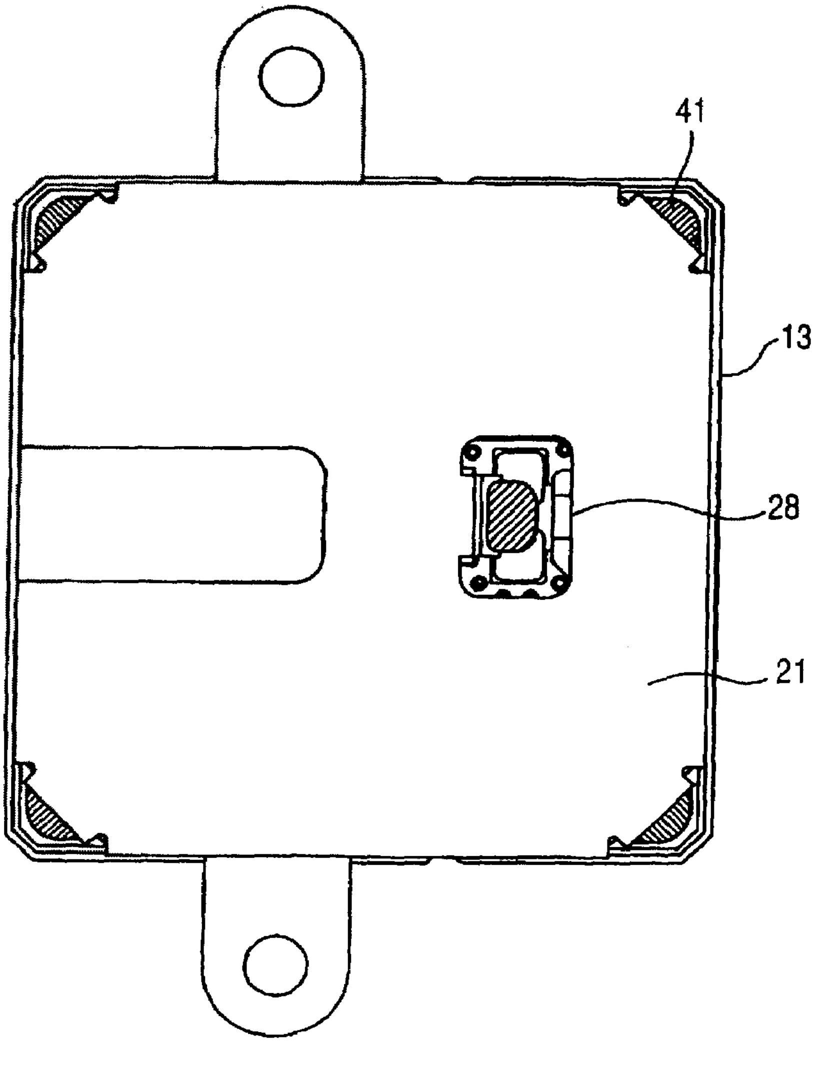
FIG. 8 is a plan view showing a state in which the shield cover is attached to a circuit board by soldering.

As shown in FIGS. 7 and 8, each corner portion 29, which is put on each extending portion 23*a*, 24*a*, 25*a*, 26*a* of each side wall portion 23, 24, 25, 26 of the shield cover 21 when each extending portion 23*a*, 24*a*, 25*a*, 26*a* is bent by the angle 45 degrees, is fixed to a reverse side of the circuit board 13 by solder 41. At this time, the protruding portions 32, 33, which are formed on both side wall portions 25, 26, are respectively inserted into the holes 13*a* formed on the circuit board 13.

In this embodiment, a small gap is formed between each side wall portion, in which each extending portion is not formed, and each corner portion. However, this small gap does not affect a function of the shield cover. Of course, when the extending portions are respectively formed on entire both sides of each side wall portion, no gaps are formed.

In the present invention, four side wall portions and four corner portions are formed by means of bending.

The embodiment of the present invention has been explained above. However, it should be noted that the present invention is not limited to the above specific embodiment.

What is claimed is:

1. A shield cover adapted to shield a circuit which is mounted on a circuit board, the shield cover comprising:

a polygonal base portion;

a first wall provided on a first side of the polygonal base portion;

a second wall provided on a second side of the polygonal base portion;

a third wall provided on a corner defined by the first side and the second side, and disposed between the first wall and the second wall;

a first extending portion extended from a side edge of the first wall so as to overlap with the third wall; and a second extending portion extended from a side edge of the second wall so as to overlap with the third wall, wherein:

the first extending portion is formed on only a part of the side edge of the first wall while separating from the polygonal base portion, the second extending portion is formed on only a part of the side edge of the second wall while separating from the polygonal base portion, and the third wall, the first extending portion, and the second extending portion are soldered to the circuit board.

2. The shield cover as set forth in claim 1, wherein:

the shield cover is monolithically formed by a metal sheet.

3. The shield cover as set forth in claim 1, wherein:

the shield cover is soldered on the circuit board.

* * * * *